United States Patent [19]
Smith et al.

[11] Patent Number: 5,552,589
[45] Date of Patent: *Sep. 3, 1996

[54] PERMANENT MAGNET ASSEMBLY WITH MR ELEMENT FOR DETECTION/AUTHENTICATION OF MAGNETIC DOCUMENTS

[75] Inventors: Neil Smith, San Diego; Frederick J. Jeffers, Escondido; Kent R. Gandola, Poway; Peter V. Koeppe, San Diego, all of Calif.

[73] Assignee: Eastman Kodak Company, Rochester, N.Y.

[*] Notice: The term of this patent shall not extend beyond the expiration date of Pat. No. 5,418,458.

[21] Appl. No.: 330,887

[22] Filed: Oct. 28, 1994

Related U.S. Application Data

[63] Continuation-in-part of Ser. No. 114,720, Aug. 31, 1993, Pat. No. 5,418,458.

[51] Int. Cl.⁶ .................................................. G06K 7/08
[52] U.S. Cl. ......................... 235/449; 324/235; 324/252; 360/113
[58] Field of Search .................................... 235/450, 449; 360/113; 324/252, 207.21, 235; 382/320

[56] References Cited

U.S. PATENT DOCUMENTS

| | | | |
|---|---|---|---|
| 3,519,899 | 7/1967 | Yamuda | 324/252 X |
| 3,796,859 | 3/1974 | Thompson | 235/61.11 |
| 3,896,292 | 7/1975 | May et al. | 235/450 |
| 4,122,505 | 10/1978 | Kuijk | 324/252 X |
| 4,300,177 | 11/1981 | Koel et al. | 360/113 |
| 4,400,752 | 10/1983 | Chabrolle | 360/113 X |
| 4,984,226 | 1/1991 | Kobori | 364/13 |
| 4,987,508 | 1/1991 | Smith | 360/113 |
| 5,021,909 | 6/1991 | Shiiba | 360/113 |
| 5,418,458 | 5/1995 | Jeffers | 235/450 X |

*Primary Examiner*—Donald T. Hajec
*Assistant Examiner*—Steven Wigmore
*Attorney, Agent, or Firm*—William F. Noval

[57] ABSTRACT

A magnetic assembly for detection and authentication of magnetic documents. The magnetic assembly includes a permanent magnet (PM), first and second magnetically soft high permeability pole pieces shaped to form a tapered, variable gap size magnetic circuit with the permanent magnet. The PM is located at a first gap between the first and second pole pieces. A magnetoresistive (MR) sensing element is located at or near the center of a second gap between said first and second pole pieces. The second gap and MR sensing element are proximate a magnetic document to be sensed.

7 Claims, 1 Drawing Sheet

PERMANENT MAGNET ASSEMBLY WITH MR ELEMENT FOR DETECTION/AUTHENTICATION OF MAGNETIC DOCUMENTS

CROSS-REFERENCE TO A RELATED APPLICATION

This application is a continuation-in-part application of copending U.S. patent application Ser. No. 08/114,720, filed Aug. 31, 1993, now U.S. Pat. No. 5,418,458, issued May 23, 1995.

FIELD OF INVENTION

This invention relates generally to the detection of magnetic fields and, more particularly to the detection of magnetic fields emanating from documents having a magnetic layer such as magnetic ink.

BACKGROUND OF THE INVENTION

In this application, the term "document" is used to refer to any valuable sheet of paper or other body having a magnetic layer such as ink containing a magnetic pigment having specified magnetic properties.

There exists a need for a magnetic assembly for detection and authentication of magnetic documents which is simple, which has high intrinsic sensitivity, which has a signal output with high signal-to-noise ratio and with independence from the speed of documents passed by the assembly, and which has minimal power dissipation and heating. Because the magnetic qualities of magnetic ink pigment is likely to be poor, with low coercivity and low square hysteresis, it is desirable to have the ability to make in-field measurements of the documents, i.e., to read their characteristic magnetic signal with an MR sensor element while the document is being simultaneously magnetized with an external magnetic field sufficiently large to partially or fully saturate the magnetic pigment in the ink of the document. It is also desirable that such a magnetic assembly reduce the reverse magnetic field seen by a document either before or after passing the MR sensor element.

A need also exists for a magnetic assembly which is capable of sensing the magnetic field in a magnetic layer of a document simultaneously with its production. U.S. Pat. No. 3,796,859, issued Mar. 12, 1974, inventor Thompson, discloses a magnetic ink recording system including a U-shaped permanent magnet recording head for magnetizing magnetic ink on a document. A magnetoresistive (MR) sensing element is located within the yoke of the permanent magnet. The MR sensing element both is biased by the permanent magnet and senses the magnetized ink simultaneously with its production. The system disclosed in this patent is disadvantageous because the yoke ends of the permanent magnet are located close to the magnetized ink of a document and tend to demagnetize the ink before it can be sensed by a magnetic read assembly downstream from the magnetic head. Moreover, the U-shaped permanent magnet can be expensive and difficult to machine for a given application.

SUMMARY OF THE INVENTION

According to the present invention, there is provided a solution to the problems of the prior art. A magnetic assembly is provided for detecting and authenticating magnetic documents which provides sufficient magnetic field to partially and/or fully saturate the magnetic layer (ink) of a document which is simultaneously magnetically sensed for purposes of identification or authentication. The magnetic assembly is simple, has high intrinsic sensitivity, has a signal output with high signal-to-noise ratio, has a signal output which is independent of the speed of a magnetic document passing the assembly, and has minimal power dissipation and heating.

According to an aspect of the present invention there is provided a magnetic assembly for both magnetizing and detecting magnetic documents comprising a permanent magnet; first and second magnetically soft, high permeability pole pieces shaped to form a tapered variable gap-size magnetic circuit with said permanent magnet, wherein said permanent magnet is located at a small gap between said first and second pole pieces; a magnetoresistive (MR) sensing element which is located at or near the center of a larger gap between said first and second pole pieces, wherein said larger gap and said MR sensing element are proximate to a magnetic document to be sensed by said MR sensing element; and wherein said magnetic field at said MR sensing element maintains said MR element in a proper magnetic bias state for achieving adequate sensitivity for detecting magnetic fields emanating from a magnetic document to be sensed.

DETAILED DESCRIPTION OF THE INVENTION

Figure 1:
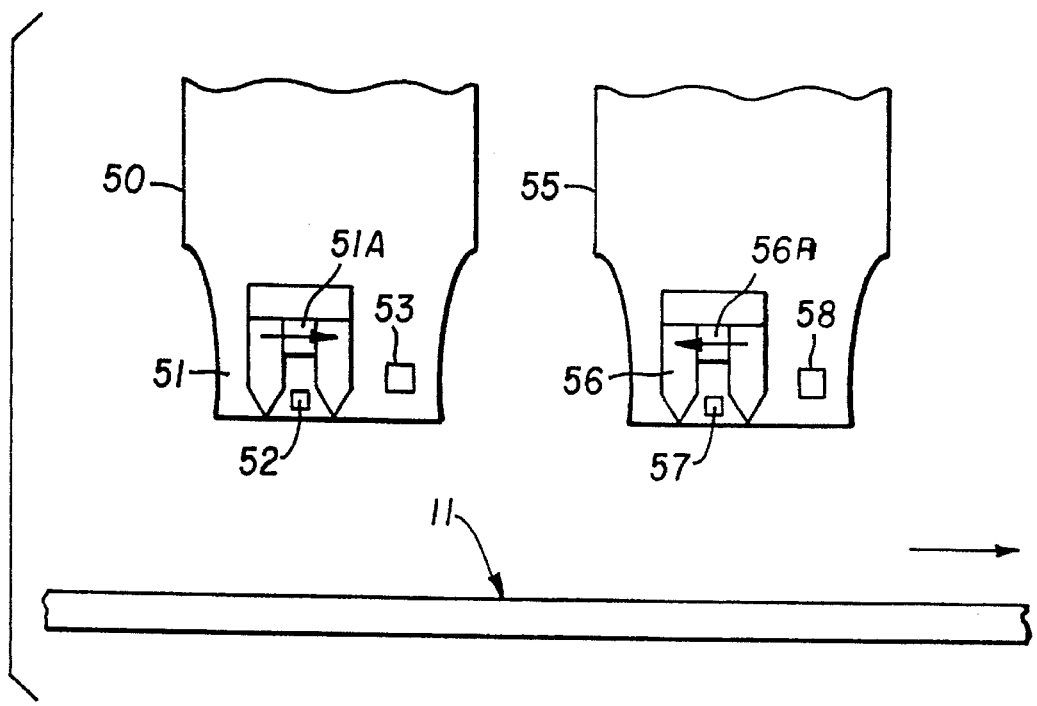
FIG. 1 is a diagrammatic view of a detection system incorporating the present invention.

Referring to FIG. 1, there is shown a magnetic head array including an embodiment of the magnetic head assembly according to the present invention. A first magnetic assembly 50 includes elements 51 for producing a saturation magnetic field, a MR sensor 52 in the gap of elements 51 for detecting the saturation moment induced in the magnetic layer by said saturation magnetic field. A secondary read head 53 may be included for detecting the remanent moment in the magnetic layer produced by the elements 51. The elements 51 include a permanent magnet 51A between soft magnetic material yokes. A second magnetic assembly 55 includes elements 56 for providing a nonsaturating magnetic field in a direction opposite to that of the field of the first magnetic assembly, a MR sensor 57 located in the gap of the field producing elements 56 for detecting the nonsaturation moment induced in the magnetic layer by said nonsaturating magnetic field. A secondary sensor 58 may be included for detecting the remanence moment of the magnetic layer resulting from the interaction of the first combined head 50 and second combined head 55. The elements 56 include a permanent magnet 56A between soft magnetic material yokes. The extra remenance detectors 53 and 58 of FIG. 1 can provide additional information for authentication of the document.

The sensing principle of detectors 52 and 57 is that of magnetoresistance. Thin films of 81/19 NiFe are located in the gaps of structures 51 and 56 so that the plane of the films are perpendicular to the large magnetic field at those points. Because the plane of the film is perpendicular to the large field, this field is not detected and the sensors can respond to the very small magnetic field emanating from the Notes with excellent signal to noise ratio. The other sensors 53 and 58 of FIG. 1 are also preferably magneto-resistive sensors in the preferred embodiment.

Figure 2:
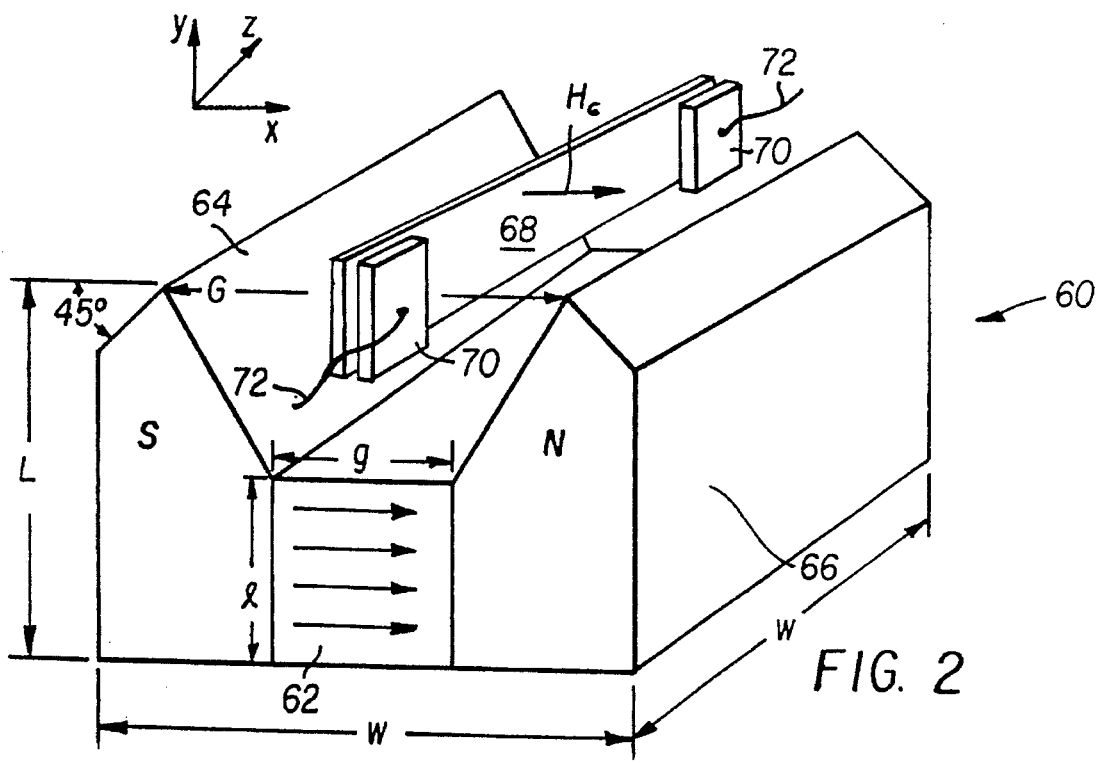
FIG. 2 is a diagrammatic perspective view of a magnetic assembly according to the invention.

A preferred embodiment of the magnetic assembly according to the present invention is shown in FIG. 2. As shown, magnetic assembly 60 includes a permanent magnet 61, magnetically soft, high permeability pole pieces 64,66 and magnetoresistive (MR) sensing element 68 located at or near the center of first gap G between pole pieces 64,66. Element 68 has conductive pads 70 and conductors 72 for carrying an electrical sensing current through sensing element 68.

The size of the first gap, G, is chosen such that the gap field, $H_G$, (along the x-direction) is sufficiently large, and the gradient, $\partial H_x/\partial y$, is sufficiently small, in order to substantially or fully magnetically saturate the magnetic component of the pigment (ink) of the document being read, over the full mechanical tolerance of the head-to-document spacing of the mechanical transport which moves the document past the MR sensing element 68 located at or near the center of the upper pole piece gap. The second gap, g, at the site of the permanent magnet (PM) 62, and equal to the thickness of the PM 62, is chosen so that the PM 62 will provide sufficient magnetomotive force to achieve sufficient magnitude of the gap field, $H_G$. Along with the PM 62 height, l, the specific size of the gap g may be optimized to operate the PM 62 material at its most efficient (B-H)$_{max}$ operating point, or to accommodate manufacturer's stock thicknesses of the PM 62 material in order to reduce the cost of PM 62 and/or mechanical assembly.

The total height, L, is chosen sufficiently large to remove the PM 62 away from the first gap such that the field gradients at or above the first gap (where the MR element 68 and document are located) are determined primarily by the pole piece 64,66 geometry, and not significantly influenced directly by stray fields from the PMS 62 itself. The sizes of g, G, l, and L are also chosen sufficiently large so that the MR sensing element 68 can be made to fit inside the volume of the pole pieces 64,66 gap region. Given the large gradients, $\partial H_y/\partial x$, of the transverse field, $H_y$, at the first gap, the MR element 68 may include additional mechanical fixturing to allow fine adjustment along the x-direction 74 of the MR element 68 position, in order that the transverse field, $H_y$, at the site of the MR element 68 allows maintenance of the MR element 68 in a proper bias magnetization state. The field, $H_y$, may additionally be exploited for use in providing the proper bias field for the given design of MR element 68.

The width, w, of the pole piece 66,64 is chosen to be as small as is mechanically convenient, while maintaining sufficiently low pole piece 66,64 reluctance for good efficiency, and avoidance of pole piece 66,64 saturation near the base of the pole pieces 66,64 adjacent to the PM 62. The trackwidth, W, is chosen with regard to the width of that portion of the document that is being magnetically detected. The approximately 45° taper at the outer corner of the pole pieces 62,64 significantly reduces the reverse field seen by a document either before or after passing over the MR element 68.

A specific design of magnetic assembly includes annealed, cold-rolled steel pole pieces 64,66, with a NdFeB permanent magnet 62 (remanence $B_r$=11 kG, coercivity $H_c$=15 kOe, and an essentially square M-H loop) with G=0.3", g=0.125" (NdFeB manufacturer's stock thickness), L=0.8", L=0.185", w=0.6", and W=3.0". This design provides a gap field of $H_G \approx$1200 Oe, and a "document field"$\geq$800 Oe for $\leq$0.08" head-to-document spacing.

Advantages

The present invention provides for an easily constructed, permanent magnet magnetizing fixture which requires no external power, and which, with practical mechanical tolerances for document-to-head spacing, can simultaneously, partially, or fully saturate the magnetic ink in a document as it is being read with a MR head for maximum sensitivity and reproducibility.

The invention has been described in detail herein with reference to the figures, however, it will be appreciated that variations and modifications are possible within the spirit and scope of the invention.

What is claimed is:

1. A magnetic assembly for both magnetizing and detecting magnetic documents comprising:

a permanent magnet;

first and second magnetically soft, high permeability pole pieces shaped to form a tapered variable gap-size magnetic circuit with said permanent magnet, wherein said permanent magnet is located at a first gap between said first and second pole pieces;

a magnetoresistive (MR) sensing element which is located substantially near the center of a second gap between said first and second pole pieces, wherein said second gap and said MR sensing element are proximate to a magnetic document to be sensed by said MR sensing element; and wherein said magnetic field at said MR sensing element maintains said MR element in a proper magnetic bias state for achieving adequate sensitivity for detecting magnetic fields emanating from a magnetic document to be sensed.

2. The magnetic assembly of claim 1 wherein said first and second pole pieces have inner and outer corners and wherein at least one outer corner of said first and second pole pieces over which a sensed magnetic document passes last in time, is relieved so as to significantly reduce, at that location, the strength of the component of magnetic field that is substantially opposite in direction to that produced at or near the center of said second gap between said first and second pole pieces.

3. The magnetic assembly of claim 1 wherein said MR sensing element is adjustably mounted within said second gap for optimizing the sensitivity of said MR sensing element.

4. The magnetic assembly of claim 1 wherein said MR sensing element comprises a nickel iron thin film layer.

5. The magnetic assembly of claim 1 wherein said permanent magnet comprises a NdFeB magnetic material.

6. The magnetic assembly of claim 1 wherein said pole pieces comprise annealed, cold-rolled steel.

7. A magnetic head array for detecting magnetic properties of a magnetic object moved relative to said array, said array comprising:

first and second magnetic assemblies spaced along a path along which a magnetic object is moved;

wherein each of said first and second magnetic assemblies include;

a permanent magnet;

first and second magnetically soft, high permeability pole pieces shaped to form a tapered variable gap-size magnetic circuit with said permanent magnet, wherein said permanent magnet is located at a first gap between said first and second pole pieces;

a magnetoresistive sensing element which is located substantially near the center of a second gap between said first and second pole pieces, wherein said second gap and said MR sensing element are proximate to a magnetic document to be sensed by said MR sensing element; and wherein said magnetic field at said MR sensing element maintains said MR element in a proper magnetic bias state for achieving adequate sensitivity for detecting magnetic fields emanating from a magnetic document to be sensed; and wherein said first magnetic assembly produces a saturation magnetic field which saturates said magnetic object, and detects the saturation moment induced in said magnetic object; and said magnetic assembly produces a nonsaturating magnetic field in a direction opposite to that the field of the first magnetic assembly, and detects the nonsaturation moment induced in said magnetic object.

* * * * *